(12) United States Patent  
Chuang et al.

(10) Patent No.: US 10,475,649 B2
(45) Date of Patent: Nov. 12, 2019

(54) PATTERNING METHOD

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Yu-Chen Chuang, Kaohsiung (TW); Fu-Che Lee, Taichung (TW); Ming-Feng Kuo, Tainan (TW); Cheng-Yu Wang, Kaohsiung (TW); Hsien-Shih Chu, Kaohsiung (TW); Li-Chiang Chen, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/972,223

(22) Filed: May 6, 2018

(65) Prior Publication Data

US 2019/0318929 A1 Oct. 17, 2019

(30) Foreign Application Priority Data

Apr. 17, 2018 (CN) .......................... 2018 1 0342025

(51) Int. Cl.
*H01L 21/033* (2006.01)
*H01L 21/768* (2006.01)
(Continued)

(52) U.S. Cl.
CPC .... *H01L 21/0337* (2013.01); *H01L 21/02065* (2013.01); *H01L 21/0332* (2013.01);
(Continued)

(58) Field of Classification Search
CPC ........... H01L 21/0337; H01L 21/02065; H01L 21/76831; H01L 21/0338; H01L 21/0332; H01L 21/0276
See application file for complete search history.

(56) References Cited

U.S. PATENT DOCUMENTS 6,638,441 B2    10/2003  Chang
7,531,456 B2    5/2009   Kwon
(Continued)

OTHER PUBLICATIONS

Chang, CN Application No. 201711082701.4, Filing Date: Nov. 7, 2017.

*Primary Examiner* — Duy Vu N Deo
(74) *Attorney, Agent, or Firm* — Winston Hsu

(57) ABSTRACT

A patterning method includes the following steps. A hard mask layer is formed on a substrate. Mandrels are formed on the hard mask layer. Mask patterns are formed on the mandrels. Each of the mask patterns is formed on one of the mandrels. Spacers are formed on the hard mask layer. Each of the spacers is formed on a sidewall of one of the mandrels and on a sidewall of one of the mask patterns. A cover layer covering the hard mask layer, the spacers and the mask patterns is formed. A planarization process is performed to remove the cover layer on the mask patterns and the spacer and remove the mask patterns. A part of the cover layer remains between the spacers after the planarization process. The mandrels and the cover layer are removed after the planarization process.

13 Claims, 9 Drawing Sheets

(51) Int. Cl.
 *H01L 21/02* (2006.01)
 *H01L 21/027* (2006.01)
(52) U.S. Cl.
 CPC .... *H01L 21/0338* (2013.01); *H01L 21/76831* (2013.01); *H01L 21/0276* (2013.01)

(56) References Cited

U.S. PATENT DOCUMENTS

| | | | |
|---|---|---|---|
| 7,696,101 B2* | 4/2010 | Li | H01L 21/3081 257/E21.035 |
| 8,642,474 B2* | 2/2014 | Kim | G03F 7/0035 257/E21.258 |
| 2008/0076071 A1 | 3/2008 | Lim | |
| 2015/0243519 A1* | 8/2015 | deVilliers | H01L 21/0337 438/692 |

* cited by examiner

PATTERNING METHOD

BACKGROUND OF THE INVENTION

1. Field of the Invention

The present invention relates to a patterning method, and more particularly, to a patterning method using a cover layer for improving the patterning performance.

2. Description of the Prior Art

The integrated circuit (IC) is constructed by devices and interconnections, which are formed by patterned feature in a substrate or in different layers. In the fabrication of IC, photolithography process has been an essential technique. The photolithography process is applied to form designed patterns such as layout patterns on one or more photomask, and then to transfer such patterns to a photoresist layer on a film by exposure and development steps for precisely transferring the complicated layout pattern to a semiconductor chip.

Along with miniaturization of semiconductor devices and progress in fabrication of semiconductor device, the conventional lithography process meets the bottleneck and the limitation. Therefore, the double patterning technique (DPT) is developed for manufacturing semiconductor devices with a further smaller dimension. Generally, the double patterning technique includes a litho-etch-litho-etch (LELE) double patterning approach, a litho-freeze-litho-etch (LFLE) double patterning approach, and a self-aligned double patterning (SADP) approach. In the SADP approach, a spacer is formed on sidewalls of a feature formed by a photo-etching process, the feature is then removed, and the pattern of the spacer is then transferred to a material layer underneath the spacer for forming a pattern with a smaller critical dimension. However, the layout pattern cannot be ideally transferred because there are still many manufacturing issues in the SADP approach, such as an etching recess loading issue on a hard mask layer under the spacer and the shape of the spacer. The manufacturing yield and the operation performance of the device formed by the SADP approach are influenced accordingly.

SUMMARY OF THE INVENTION

A patterning method is provided in the present invention. A cover layer is applied to cover a hard mask layer, spacers, and mask patterns. A planarization process is performed to remove the cover layer on the spacer and remove the mask patterns for avoiding etching recesses formed on the hard mask layer during the step of removing the mask patterns and planarizing the top surfaces of the spacers.

According to an embodiment of the present invention, a patterning method is provided. The patterning method includes the following steps. A hard mask layer is formed on a substrate. Mandrels are formed on the hard mask layer. Mask patterns are formed on the mandrels. Each of the mask patterns is formed on one of the mandrels. Spacers are formed on the hard mask layer. Each of the spacers is formed on a sidewall of one of the mandrels and on a sidewall of one of the mask patterns. A cover layer is formed covering the hard mask layer, the spacers and the mask patterns. A planarization process is performed to remove the cover layer on the mask patterns and the spacers and remove the mask patterns. Apart of the cover layer remains between the spacers after the planarization process. The mandrels and the cover layer are removed after the planarization process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a patterning method according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

Figure 1:
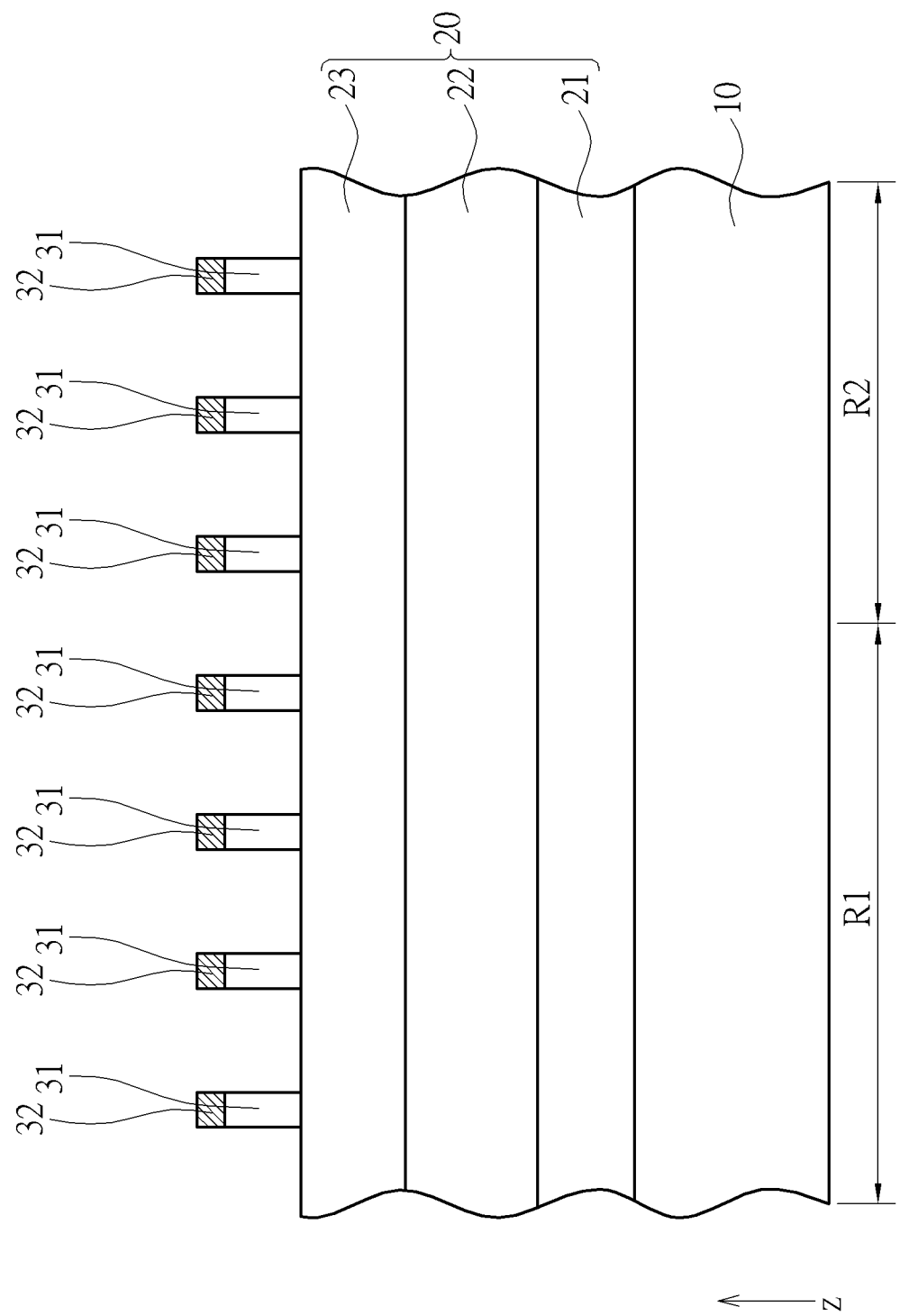

Please refer to FIGS. 1-8. FIGS. 1-8 are schematic drawings illustrating a patterning method according to a first embodiment of the present invention. The patterning method in this embodiment may include the following steps. As shown in FIG. 1, a hard mask layer 20 is formed on a substrate 10. The substrate 10 may include a semiconductor substrate or a non-semiconductor substrate. The semiconductor substrate mentioned above may include a silicon substrate, an epitaxial silicon substrate, a silicon germanium substrate, a silicon carbide substrate, a silicon-on-insulator (SOI) substrate, or substrates formed by other suitable semiconductor materials. The none-semiconductor substrate mentioned above may include a glass substrate, a ceramic substrate, a plastic substrate, or substrates formed by other suitable non-semiconductor materials. The hard mask layer 20 may include a structure composed of a single material layer or multiple layers of materials. For example, the hard mask layer 20 may include a first hard mask layer 21, a second hard mask layer 22, and a third hard mask layer 23 sequentially stacked in a thickness direction Z, but not limited thereto. The first hard mask layer 21, the second hard mask layer 22, and the third hard mask layer 23 may be respectively formed by different conductive materials and/or insulation materials, such as silicon oxide, silicon nitride, silicon oxynitride, amorphous silicon, or polysilicon. In some embodiments, the hard mask layer 20 may be the etching target layer in the patterning method, or the hard mask layer 20 may be patterned to be an etching mask for etching the substrate 10 and/or other material layers (not shown) on the substrate 10.

Subsequently, a plurality of mandrels 31 are formed on the hard mask layer 20, and a plurality of mask patterns 32 are formed on the mandrels 31. Each of the mask patterns 32 is formed on one of the mandrels 31. In some embodiments, the mandrels 31 and the mask patterns 32 may be formed by the same photolithography and etching process. The projection pattern of the mandrels 31 in the thickness direction Z may be substantially the same as the projection pattern of the mask patterns 32 in the thickness direction Z, and the mandrels 31 and the mask patterns 32 may overlap one another in the thickness direction Z, but not limited thereto. Additionally, the material of the mandrels 31 may include a dielectric material such as an organic dielectric layer (ODL) or other suitable materials, and the mask patterns 32 may include an anti-reflection material such as a silicon-containing hard mask bottom anti-reflecting coating (SHB) and/or a dielectric anti-reflective coating (DARC), or other suitable materials. Additionally, in some embodiments, a first region R1 and a second region R2 adjacent to the first region R1 may be defined on the substrate 10. The hard mask layer 20, the mandrels 31, and the mask patterns 32 may be formed on the first region R1 and the second region R2. For example, when the patterning method of the present invention is applied in a manufacturing method of a semiconductor memory device, the first region R1 may include a memory cell region, and the second region R2 may include a peripheral circuit region, but not limited thereto.

Figure 2:
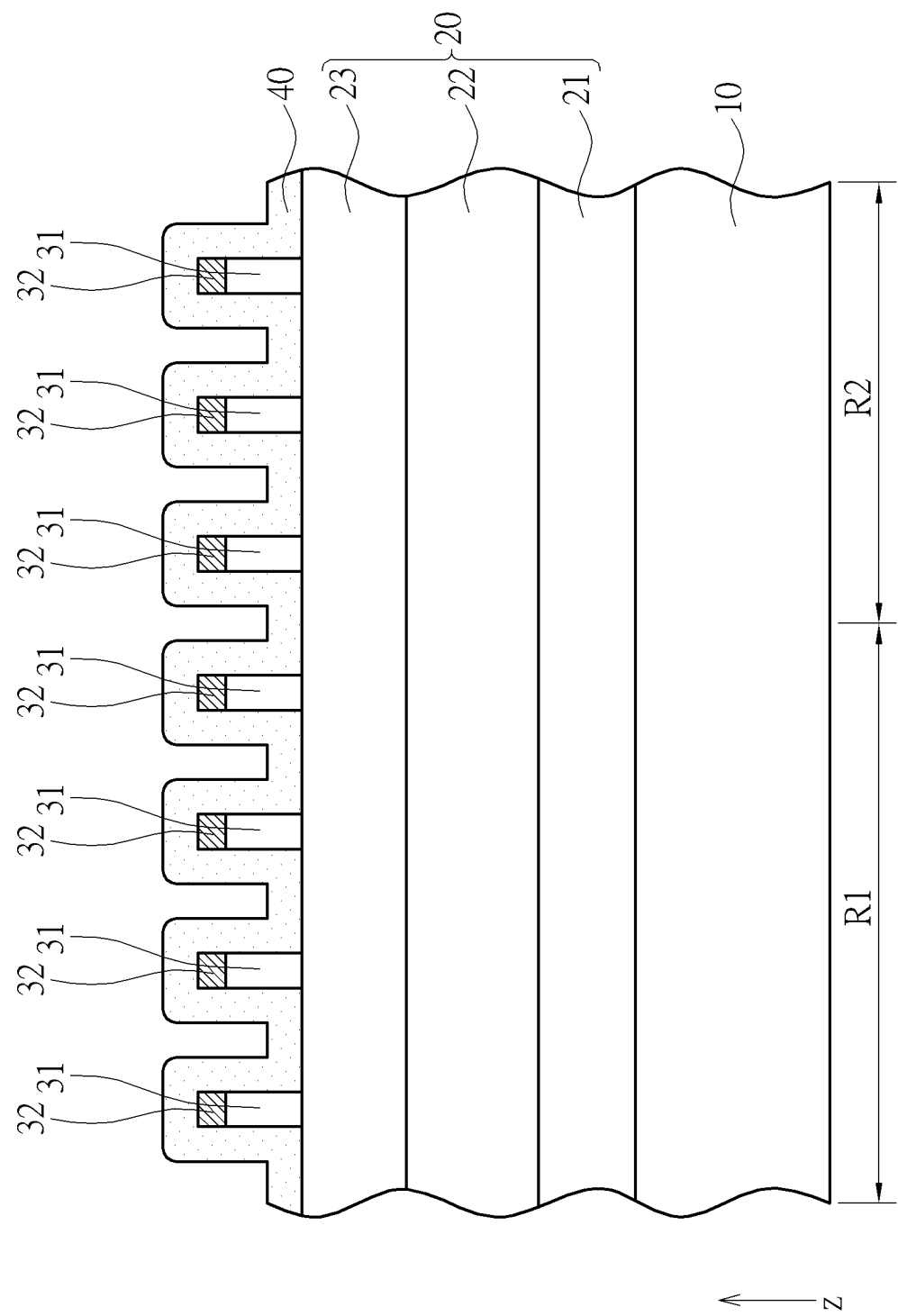
Figure 3:
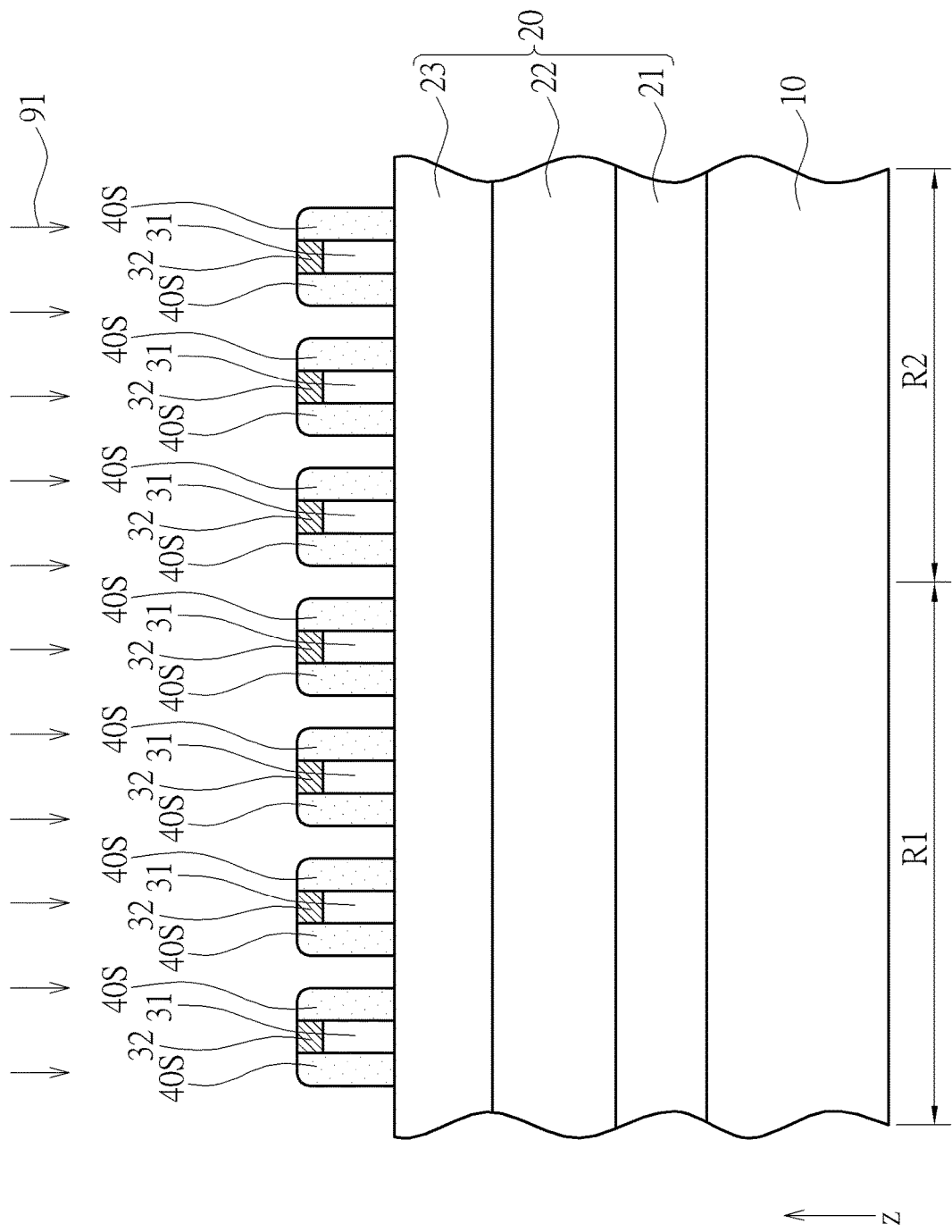

As shown in FIG. 2 and FIG. 3, a plurality of spacers 40S are then formed on the hard mask layer 20. Each of the spacers 40S is formed on a sidewall of one of the mandrels 31 and on a sidewall of one of the mask patterns 32. Therefore, the spacers 40S are formed on the first region R1 and the second region R2 also. The step of forming the spacers 40S may include but is not limited to the following steps. As shown in FIG. 2, a spacer material layer 40 is conformally formed on the hard mask layer 20, the mandrels 31, and the mask patterns 32. The mandrels 31 and the mask patterns 32 are covered by the spacer material layer 40. Subsequently, as shown in FIG. 2 and FIG. 3, an etching back process 91 is performed to the spacer material layer 40 for forming the spacers 40S. For forming the spacers 40S on the sidewall of each of the mandrels 31 and the sidewall of each of the mask patterns 32, the etching back process 91 is an anisotropic etching process preferably, and the spacing between the mandrels 31 and the spacing between the mask patterns 32 are not completely filled with the spacer material layer 40 preferably, but not limited thereto. In other embodiments of the present invention, the spacers 40S may be formed by methods different from the method described above according to some considerations.

Additionally, in some embodiments, the spacer material layer 40 overlapping the mask patterns 32 in the thickness direction Z of the hard mask layer 20 may be removed by the etching back process 91, a part of the hard mask layer 20 may be exposed by the etching back process 91, and the hard mask layer 20 is not etched by the etching back process 91 preferably. In other words, the spacer material layer 40 and the third hard mask layer 23 may have higher etching selectivity in the etching back process 91 for avoiding etching the third hard mask layer 23 in the etching back process 91 and forming etching recesses in the third hard mask layer 23. For example, when the third hard mask layer 23 is nitride such as silicon nitride, the spacer material layer 40 may be oxide such as silicon oxide formed by an atomic layer deposition (ALD) process, and an adequate etching back process 91 may be used to obtain the required etching selectivity, but not limited thereto.

Figure 4:
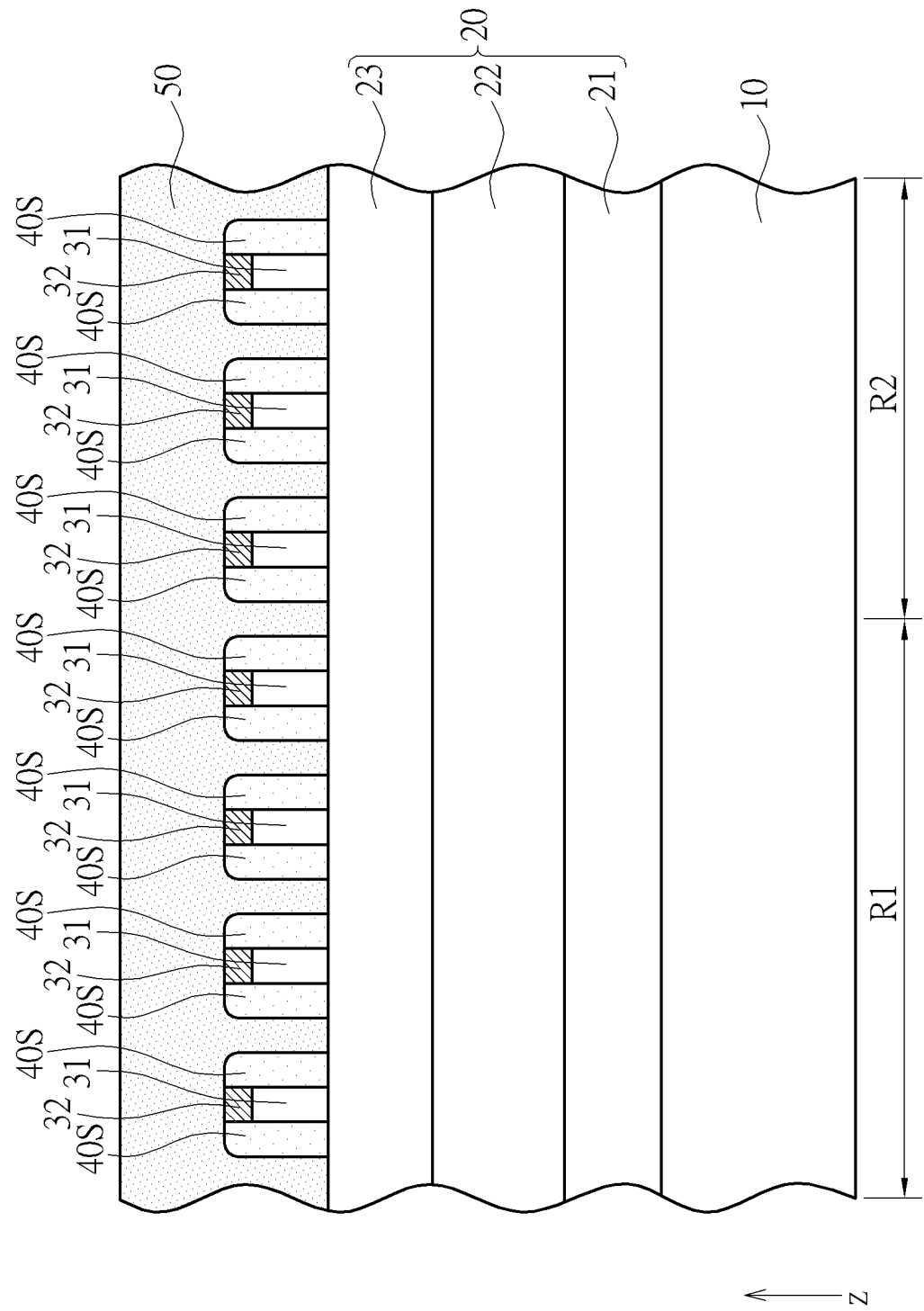

As shown in FIG. 4, a cover layer 50 is formed covering the hard mask layer 20, the spacers 40S, the mask patterns 32, and the mandrels 31. Therefore, the cover layer 50 is formed on the first region R1 and the second region R2 also. The material of the cover layer 50 may include a photoresist material, an organic dielectric material, or other materials capable of generating a planarization effect. In some embodiments, the material of the cover layer 50 may be identical to the material of the mandrels 31 for being removed together in the subsequent process, but not limited thereto. Additionally, the hard mask layer 20 exposed by the above-mentioned etching back process of forming the spacer 40S may be covered by the cover layer 50. The spacing between the spacers 40S may be filled with the cover layer 50, and the top surface of the cover layer 50 may be higher than the top surface of the spacers 40S and the top surface of the mask patterns 32 in the thickness direction Z of the hard mask layer 20, but the present invention is not limited to this. In some embodiments of the present invention, the cover layer 50 may be formed on the hard mask layer 20, and the spacing between the spacers 40S is not completely filled with the cover layer 50. Therefore, a top surface of the cover layer 50 may be lower than the top surface of the spacers 40S and the top surface of the mask patterns 32 in the thickness direction Z of the hard mask layer 20.

Figure 5:
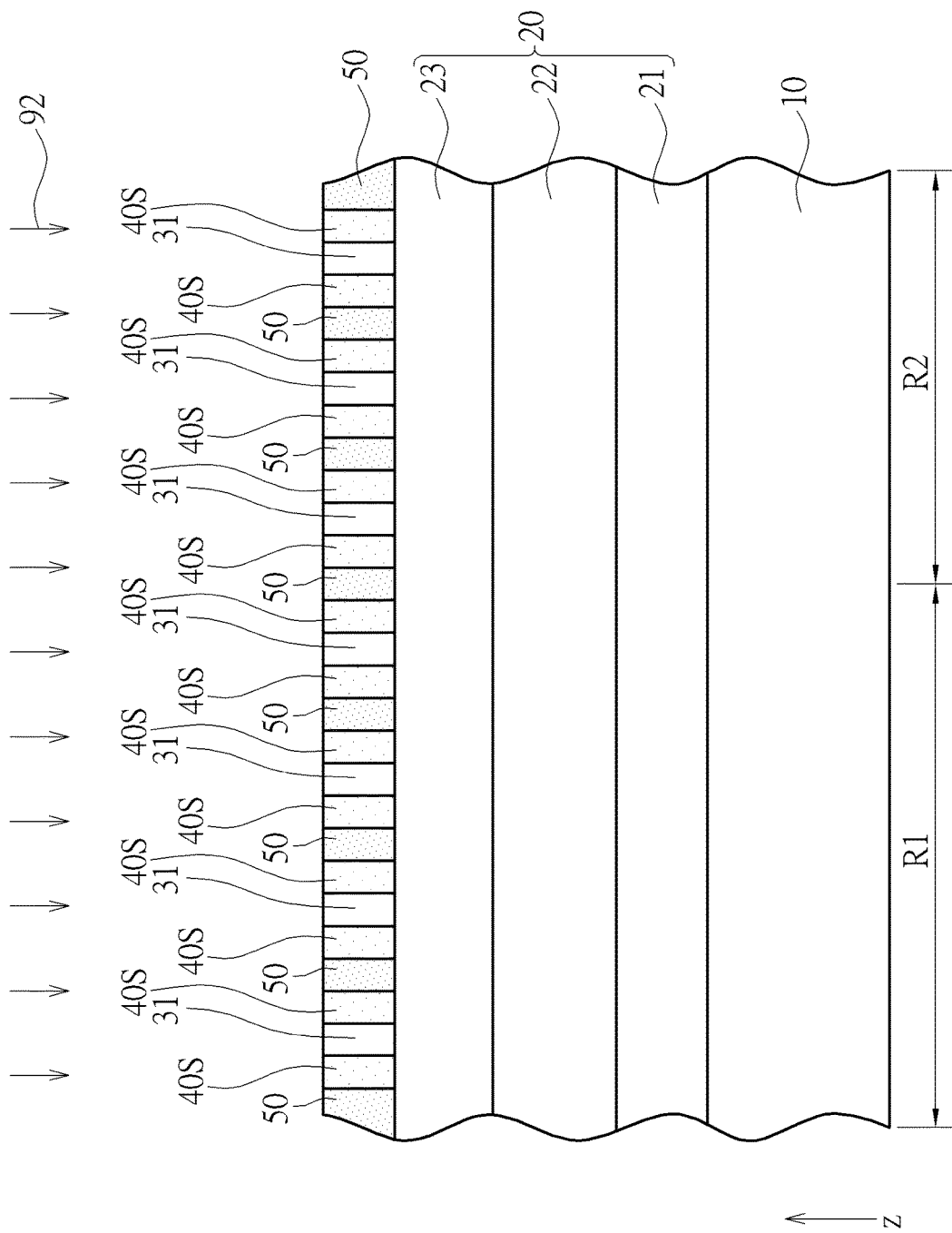

As shown in FIG. 4 and FIG. 5, a planarization process 92 is then performed to remove the cover layer 50 on the mask patterns 32 and the spacers 40S and remove the mask patterns 32. A part of the cover layer 50 remains between the spacers 40S after the planarization process 92. In some embodiments, the top surface of the cover layer 50 may be higher than the top surface of the spacers 40S and the top surface of the mask patterns 32 before the planarization process 92, and the top surface of the cover layer 50, the top surface of the spacers 40S, and the top surface of the mandrels 31 may be coplanar after the planarization process 92, but not limited thereto. The planarization process 92 may include an etching back process, a chemical mechanical polishing (CMP) process, or other suitable planarization processes.

In some embodiments, a top portion of each of the spacers 40S may be removed by the etching back process of the planarization process 92, and an etching rate of the cover layer 50 in the etching back process may be substantially equal to an etching rate of the spacers 40S in the etching back process and an etching rate of the mandrels 31 in the etching back process for controlling the shape and the height of the spacers 40S more effectively. For instance, the etching rate of the cover layer 50 in this etching back process may be substantially equal to the etching rate of the spacers 40S in this etching back process and the etching rate of the mandrels 31 in this etching back process with a tolerance of ±10%, but not limited thereto. In some embodiments, the top portion of each of the spacers 40S may have a horn shape before the planarization process 92, and the cross-sectional shape of each of the spacers 40S may be close to an rectangle after the planarization process 92 for avoiding influencing the subsequent pattern transferring performance by the shape of the spacers 40S. Additionally, the mask patterns 32 may be completely removed by the planarization process 92, and the hard mask layer 20 exposed by the etching back process of forming the spacers 40S may still be covered by the cover layer 50 in the planarization process 92 for avoiding forming etching recesses in the hard mask layer 20 during the step of removing the mask patterns 32. The influence of the etching recesses on the subsequent etching process may be reduced accordingly.

Figure 6:
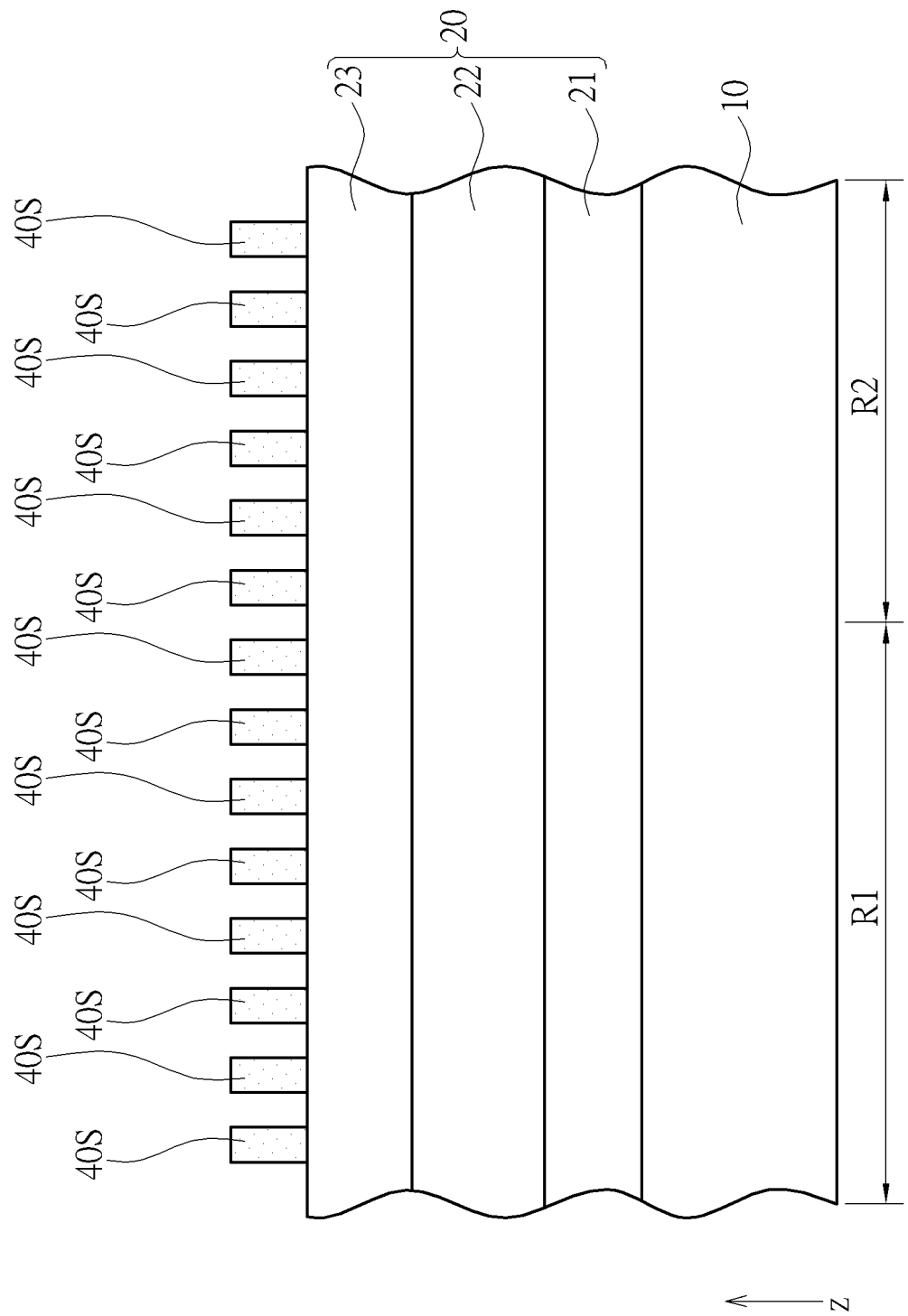
Figure 7:
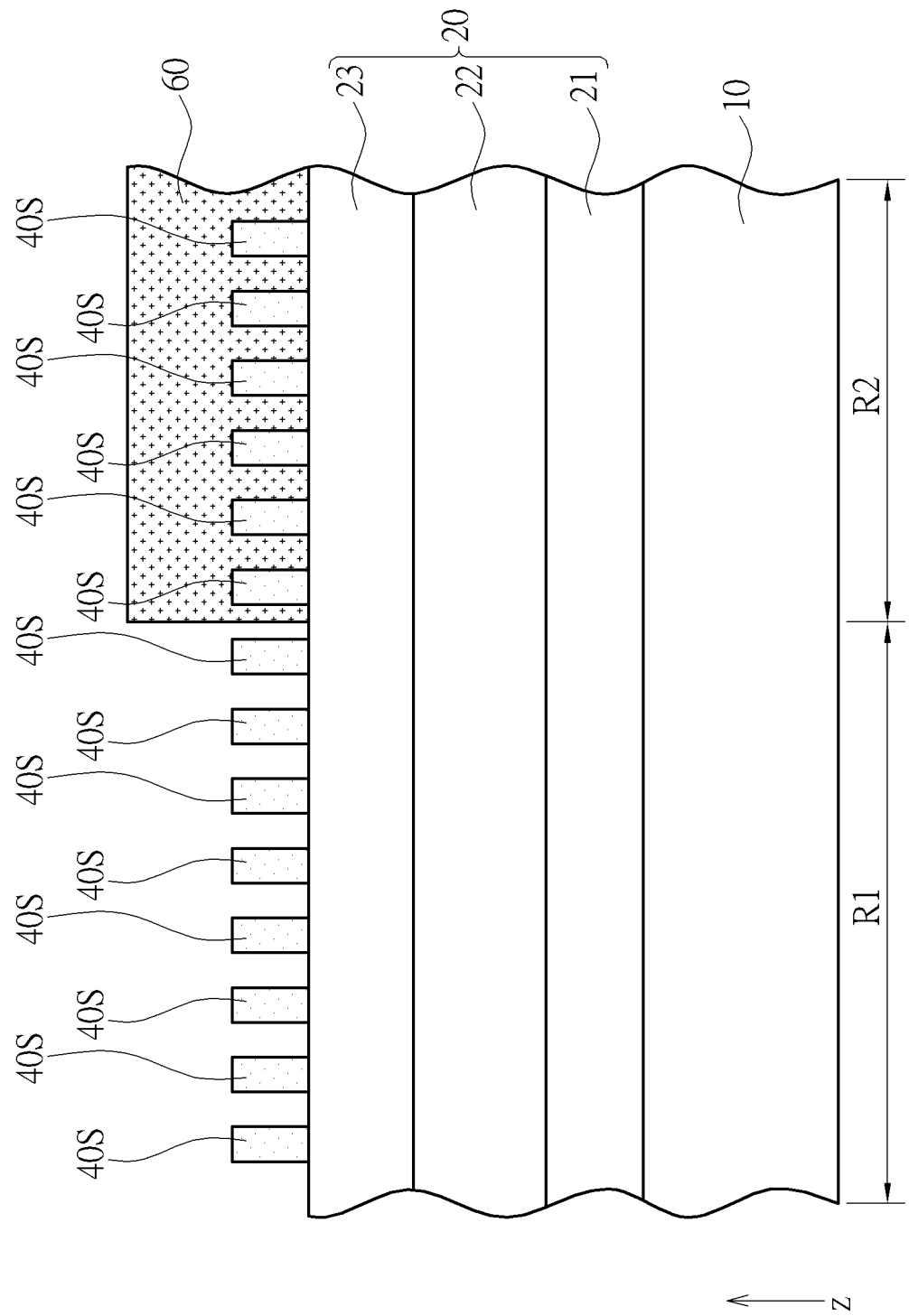

As shown in FIG. 5 and FIG. 6, the mandrels 31 and the cover layer 50 are removed after the planarization process 92, and the spacers 40S arranged separately remain on the hard mask layer 20. In some embodiments, the material of the cover layer 50 may be identical to the material of the mandrels 31 preferably, and the cover layer 50 and the mandrels 31 may be removed together after the planarization process 92 for process simplification, but not limited thereto. In some embodiments, at least a part of the spacers 40S may be used as an etching mask in an etching process performed to the hard mask layer 20 for transferring the pattern of the spacers 40 to the hard mask layer 20, and the third hard mask layer 23 may be etched for forming a plurality of patterned structures 23P, for example, but not limited thereto.

As shown in FIGS. 5-8, the pattern of at least a part of the spacers 40S may be transferred to the hard mask layer 20 after the step of removing the mandrels 31 and the cover layer 50. Additionally, when only the pattern of the spacers 40S on the first region R1 are required to be transferred to the hard mask layer 20, a patterned mask layer 60 may be formed covering the spacers 40S on the second region R2, and the patterned mask layer 60 may cover the spacers 40S on the second region R2 during the step of transferring the pattern of the spacers 40S on the first region R1 to the hard mask layer 20 for avoiding transferring the pattern of the spacers 40S on the second region R2. In addition, the patterned mask layer 60 may be removed after the step of forming the patterned structures 23P.

In some embodiments, the patterned structures 23P may be used as an etching mask in an etching process performed to the substrate 10 for forming trenches in the substrate 10, and the trenches in the substrate 10 may be used to form shallow trench isolation (STI) in the substrate 10. When the trenches required in the first region R1 and the trenches required in the second region R2 have different shapes and sizes, the patterned mask layer 60 mentioned above may be used to avoid transferring the pattern of the spacers 40S on the second region R2 to the hard mask layer 20, and another patterning process may be performed subsequently to form the required patterned structures (not shown) in the hard mask layer 20 above the second region R2, but not limited thereto.

In some embodiments, the patterned mask layer 60 may include a patterned photoresist or other suitable mask materials, and the patterned mask layer 60 may be formed after the step of removing the mandrels 31 and the cover layer 50, but not limited thereto. Additionally, it is worth noting that there is not any etching recess formed in the hard mask layer 20 during the planarization process 92 because the hard mask layer 20 is covered by the mandrels 31, the spacers 40S, and the cover layer 50 during the planarization process 92, and the height uniformity of the top surface of the hard mask layer 20 between the spacers 40S after the step of removing the mandrels 31 and the cover layer 50 may be improved accordingly. The performance of transferring the pattern of the spacers 40S to the hard mask layer 20 may be enhanced. For example, problems such as the pattern distortion issue of the patterned structures 23P and/or the pitch distribution uniformity of the patterned structures 23P may be improved.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
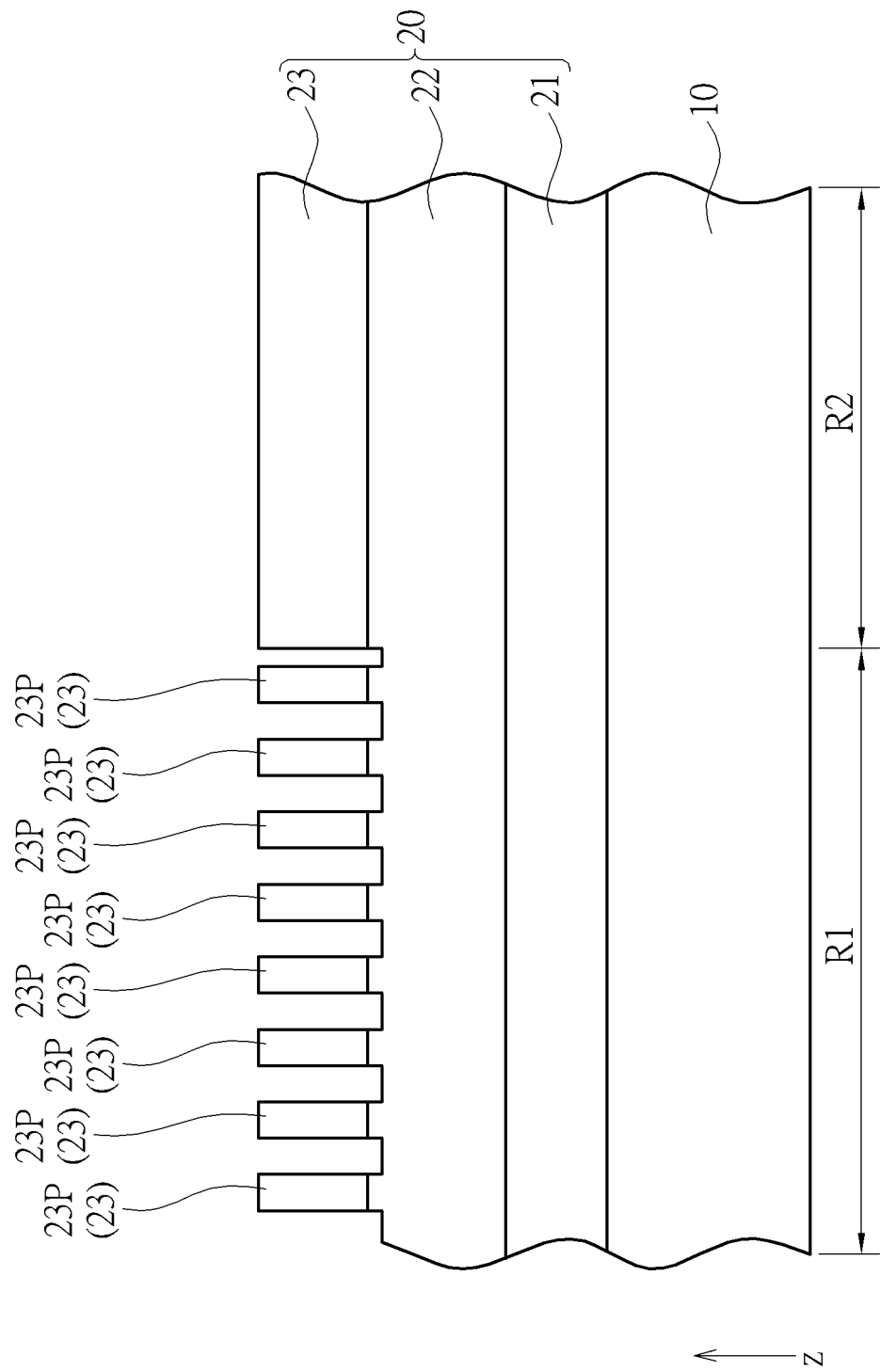
Figure 9:
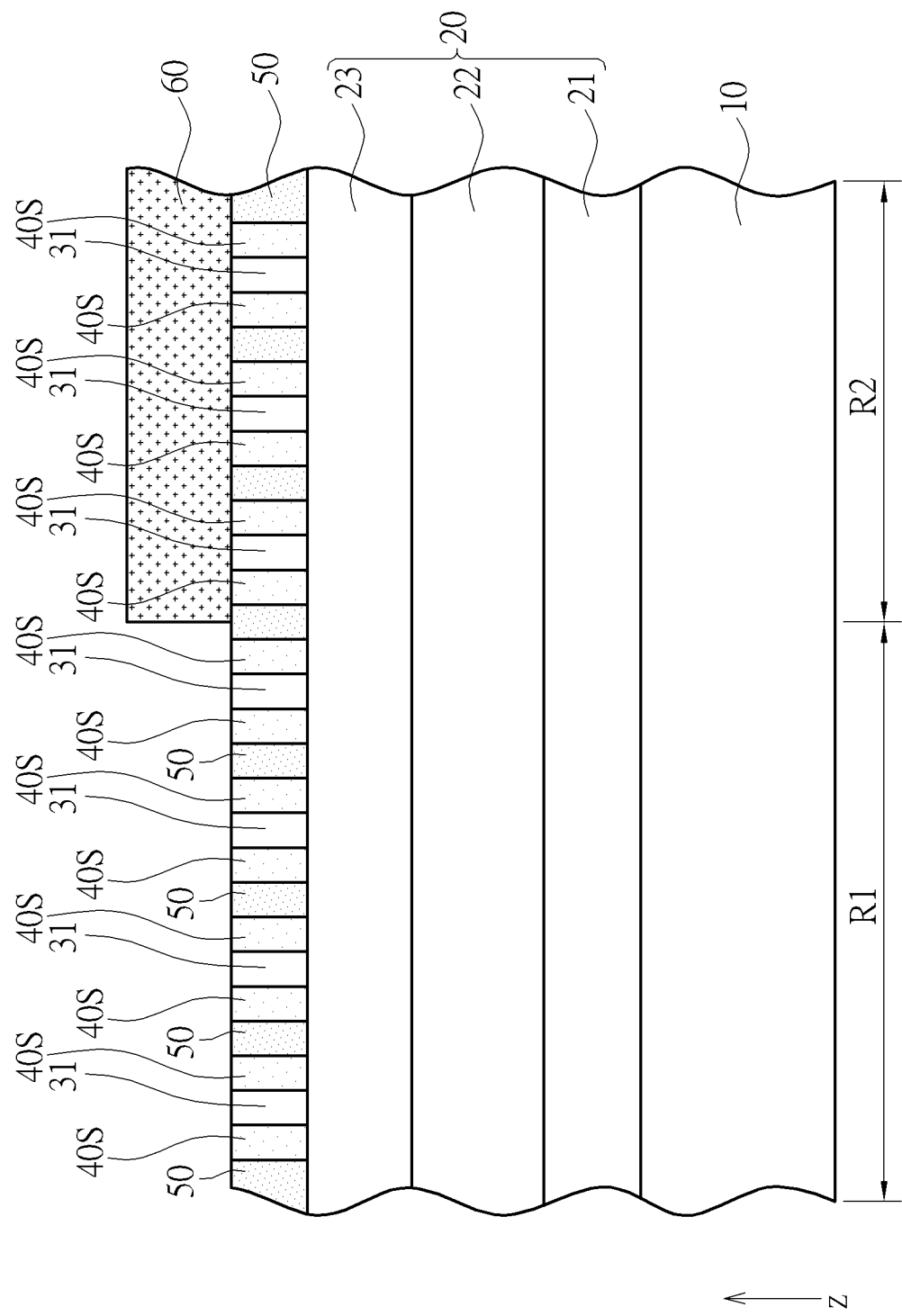
FIG. 9 is a schematic drawing illustrating a patterning method according to a second embodiment of the present invention.

Please refer to FIG. 5, FIG. 9, and FIG. 8. FIG. 9 is a schematic drawing illustrating a patterning method according to a second embodiment of the present invention. FIG. 9 may be regarded as a schematic drawing in a step subsequent to 5, and FIG. 8 may be regarded as a schematic drawing in a step subsequent to FIG. 9. As shown in FIG. 5, FIG. 9, and FIG. 8, the difference between the patterning method in this embodiment and the patterning method in the first embodiment is that the patterned mask layer 60 in this embodiment may be formed after the planarization process 92 and before the step of removing the mandrels 31 and the cover layer 50. Therefore, in this embodiments, the patterned mask layer 60 may cover the mandrels 31 on the second region R2, the spacers 40S on the second region R2, and the cover layer 50 on the second region R2. The patterned mask layer 60, the mandrels 31 on the second region R2, the spacers 40S on the second region R2, and the cover layer 50 on the second region R2 may be removed after the step of forming the patterned structures 23P, but not limited thereto.

To summarize the above descriptions, in the patterning method of the present invention, the cover layer may be sued to cover the hard mask layer, the spacers, and the mask patterns, and the planarization process may be performed to remove the cover layer on the spacers and remove the mask patterns. The hard mask layer is covered by the cover layer in the planarization process for avoiding etching recesses formed in the hard mask layer in the process of removing the mask patterns, and the performance of transferring the pattern of the spacers to the hard mask layer may be enhanced accordingly. Additionally, the planarization process may also be used to planarize the top portion of the spacer for avoiding generating negative influence of the shape of the spacer on the pattern transferring performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A patterning method, comprising:
    forming a hard mask layer on a substrate;
    forming mandrels on the hard mask layer;
    forming mask patterns on the mandrels, wherein each of the mask patterns is formed on one of the mandrels;
    forming spacers on the hard mask layer, wherein each of the spacers is formed on a sidewall of one of the mandrels and on a sidewall of one of the mask patterns;
    forming a cover layer covering the hard mask layer, the spacers and the mask patterns, wherein a material of the mandrels is identical to a material of the cover layer;
    performing a planarization process to remove the cover layer on the mask patterns and the spacers and remove the mask patterns, wherein a part of the cover layer remains between the spacers after the planarization process; and
    removing the mandrels and the cover layer after the planarization process.

2. The patterning method according to claim 1, wherein the step of forming the spacers comprises:
    forming a spacer material layer conformally on the hard mask layer, the mandrels, and the mask patterns, wherein the mandrels and the mask patterns are covered by the spacer material layer; and
    performing an etching back process to the spacer material layer for forming the spacers.

3. The patterning method according to claim 2, wherein a part of the hard mask layer is exposed by the etching back process, and the hard mask layer is not etched by the etching back process.

4. The patterning method according to claim 2, wherein the spacer material layer overlapping the mask patterns in a thickness direction of the hard mask layer is removed by the etching back process.

5. The patterning method according to claim 1, wherein a top surface of the cover layer is higher than a top surface of the spacers and a top surface of the mask patterns before the planarization process.

6. The patterning method according to claim 5, wherein the top surface of the cover layer, the top surface of the spacers, and a top surface of the mandrels are coplanar after the planarization process.

7. The patterning method according to claim 1, wherein the planarization process comprises an etching back process.

8. The patterning method according to claim 7, wherein a top portion of each of the spacers is removed by the etching back process, and an etching rate of the cover layer in the etching back process is substantially equal to an etching rate of the spacers in the etching back process.

9. The patterning method according to claim 1, further comprising:

transferring the pattern of at least a part of the spacers to the hard mask layer after the step of removing the mandrels and the cover layer.

10. The patterning method according to claim 9, wherein a first region and a second region adjacent to the first region are defined on the substrate, and the mandrels, the spacers, and the cover layer are formed on the first region and the second region.

11. The patterning method according to claim 10, further comprising:

forming a patterned mask layer covering the spacers on the second region, wherein the patterned mask layer covers the spacers on the second region during the step of transferring the pattern of at least a part of the spacers to the hard mask layer.

12. The patterning method according to claim 11, wherein the patterned mask layer is formed after the step of removing the mandrels and the cover layer.

13. The patterning method according to claim 11, wherein the patterned mask layer is formed after the planarization process and before the step of removing the mandrels and the cover layer.

* * * * *